United States Patent
Nakamura et al.

(10) Patent No.: US 7,253,473 B2
(45) Date of Patent: Aug. 7, 2007

(54) SEMICONDUCTOR DEVICE AND METHOD OF MANUFACTURING THE SAME

(75) Inventors: Kazutoshi Nakamura, Yokohama (JP); Syotaro Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/245,204

(22) Filed: Oct. 7, 2005

(65) Prior Publication Data
US 2006/0081920 A1    Apr. 20, 2006

(30) Foreign Application Priority Data
Oct. 18, 2004  (JP) .............................. 2004-303087

(51) Int. Cl.
*H01L 29/76* (2006.01)
*H01L 21/336* (2006.01)

(52) U.S. Cl. ............... 257/330; 257/333; 257/E29.201; 438/268; 438/270

(58) Field of Classification Search ........ 257/328–333, 257/E29.262, E29.201, E21.41, E21.429; 438/268, 270
See application file for complete search history.

(56) References Cited

U.S. PATENT DOCUMENTS

| | | | | |
|---|---|---|---|---|
| 6,228,720 B1* | 5/2001 | Kitabatake et al. | .......... | 438/268 |
| 6,717,210 B2* | 4/2004 | Takano et al. | ............... | 257/330 |
| 6,750,511 B2* | 6/2004 | Kawano et al. | .............. | 257/332 |
| 6,855,601 B2* | 2/2005 | Gajda | .......................... | 438/259 |
| 6,943,408 B2* | 9/2005 | Wu et al. | .................... | 257/329 |
| 6,974,749 B2* | 12/2005 | Lai et al. | ..................... | 438/270 |
| 6,977,203 B2* | 12/2005 | Hshieh et al. | .............. | 438/268 |
| 7,148,527 B2* | 12/2006 | Kim et al. | .................. | 257/288 |
| 2002/0115257 A1* | 8/2002 | Inagawa et al. | ............ | 438/270 |
| 2005/0029586 A1 | 2/2005 | Ono et al. | | |

FOREIGN PATENT DOCUMENTS

JP        2002-368220        12/2002

OTHER PUBLICATIONS

U.S. Appl. No. 11/245,204, filed Oct. 7, 2005, Nakamura et al.
U.S. Appl. No. 11/358,225, filed Feb. 22, 2005, Nakamura et al.

* cited by examiner

*Primary Examiner*—T. N. Quach
(74) *Attorney, Agent, or Firm*—Oblon, Spivak, McClelland, Maier & Neustadt, P.C.

(57) ABSTRACT

A semiconductor device includes: a semiconductor substrate of the first-type; a semiconductor region of the first-type formed on the substrate; a gate electrode a part of which is present within a trench selectively formed in part of the semiconductor region, and an extended top-end to have a wide width via a stepped-portion; a gate insulating-film formed between the trench and the gate electrode along a wall surface of the trench; a base layer of the second-type on the region via the film to enclose a side-wall except a bottom of the trench; a source region of the first-type adjacent to the film outside the trench in the vicinity of a top surface of the base layer; and an insulating-film formed partially between a bottom-surface of the top-end and a top-surface of the source region and formed to have a thickness larger than that of the gate insulating-film within the trench.

20 Claims, 9 Drawing Sheets

SEMICONDUCTOR DEVICE AND METHOD OF MANUFACTURING THE SAME

CROSS REFERENCE TO RELATED APPLICATION

This application claims benefit of priority under 35 USC §119 to the Japanese Patent Application No. 2004-303087, filed on Oct. 18, 2004, and the entire contents of which are incorporated by references herein.

BACKGROUND OF THE INVENTION

The present invention relates to a semiconductor device and, more particularly, to the construction of a vertical field effect transistor which is used as a device for high-speed switching operation and a power device.

The trend in power sources used in CPUs (Central Processing Units) of computers and the like is reduction of an output voltage level. In this connection, power sources by synchronous rectifier techniques have been frequently used. As a semiconductor device applied to a power source by synchronous rectifier techniques, there is a MOSFET (a Metal Oxide Semiconductor Field Effect Transistor), for example. And in this MOSFET, it is required that switching losses and conducting losses of a switching component on the high-voltage side be reduced. As prior art which involves providing a gate electrode via a gate insulating film within a trench up to a semiconductor substrate of the first conduction type after the passage of a base (body) region, there are vertical MOSFETs disclosed in the Japanese Patent Laid-Open No. 5-335582 and the Japanese Patent Laid-Open No. 7-326755. Also, as prior art which involves providing silicide on the top surface of an upper end portion of a gate electrode, there is a MOSFET disclosed in the Japanese Patent Laid-Open No. 2002-368220.

FIG. 17 shows the sectional construction of a conventional MOSFET and a detailed construction of the conventional MOSFET will be described by using this figure. For a simplified description, an n-channel type MOSFET is taken as an example. By reversing p to n, the same description applies to a p-channel type MOSFET. An n$^-$-type semiconductor layer 2 is formed on an n$^+$-type semiconductor substrate 1 by epitaxial growth. A p-type base region 3 is formed on this n$^-$-type semiconductor layer 2, and a trench 4 is formed so as to penetrate the p-type base region 3. A gate insulating film 5 is present on the surface of this trench 4, and via this gate insulating film 5 polycrystalline silicon is buried as a gate 6. Adjacent to this trench 4, an n$^+$-type source 7 and a p$^+$-type contact region 8 which comes into contact with a p-type base region 3 are provided. A source electrode 9 is formed via top metals 9a, 9b each of which comes into contact with both of the source region 7 and the body region (contact region 8). A drain electrode 10 is formed on the back side of the n$^+$-type semiconductor substrate 1.

It is generally known that reducing the feedback capacitance Cgd between the gate and the drain of the gate insulating film 5 shown in FIG. 17 is important for reducing switching losses. In order to reduce the feedback capacitance Cgd between the gate and the drain, it is conceivable to shorten the length of a portion protruding from the p-type base region 3 or narrow the width (thickness) of the trench. Also, because it is effective to shorten the channel length in reducing the on-resistance of a MOSFET, it is conceivable to shorten the length d in FIG. 17 which corresponds to the depth of the trench 4.

When switching losses and conducting losses are to be reduced by use of the above-described construction in a semiconductor device such as a vertical field-effect transistor, the sectional area of a gate electrode and polycrystalline silicon in a direction orthogonal to the direction in which a drain current flows decreases. Gate resistance increases when such a construction is adopted. Therefore, there has been known a construction in which a lower portion of the gate electrode 6 present within the trench 4 is constructed to be slender and the upper portion is widened via a stepped part and a silicide region 11, which is formed as a metal film formed from a metal or a metal oxide, is added to the upper part of the gate electrode 6. Gate resistance can be decreased by increasing the area of the silicide region 11 as a metal film.

In the conventional construction, the length Lf of the portion which is expanded wider than the lower portion of the gate electrode 6 is increased, whereby the area of the silicidized region 11 is increased and gate resistance can be reduced. On the other hand, however, the gate-source capacitance Cgs in the gate insulating film 5 between the source region 7 and the expanded portion opposite to this source region 7 also increases and this leads to an increase in the input capacitance of the MOSFET. Such an increase in the input capacitance results in an increase in drive losses in the MOSFET and becomes the cause of worsening of the efficiency of a power supply. That is, a decrease in gate resistance and a decrease in the input capacitance are in antimonic relation, and a tradeoff relation arises in such a manner that an increase in the input capacitance is induced if only a reduction of gate resistance is sought after, whereas gate resistance increases if the input capacitance is to be reduced.

As is apparent from the above description, if the area of the silicidized region is increased by increasing the length of the expanded portion of the conventional construction, the gate-source capacitance Cgs in the gate insulating film 5 between the expanded portion and the source region 7 increases and this leads to an increase in the input capacitance of the MOSFET. Such an increase in the input capacitance results in an increase in drive losses in the MOSFET and becomes the cause of worsening of the efficiency of a power supply.

It is desired to provide a semiconductor device which reduces gate resistance by ensuring a sufficient area of a silicide region and can prevent an increase in drive losses by preventing an increase in the input capacitance.

SUMMARY OF THE INVENTION

A semiconductor device related to the first basic constitution is constituted by a semiconductor substrate of the first conduction type; a semiconductor region of the first conduction type which is formed on the semiconductor substrate; a gate electrode at least part of which is present within a trench which is selectively formed in part of the semiconductor region, and an extended top end portion of which is formed to have a broad width via a stepped portion; a gate insulating film which is formed between the trench and the gate electrode along a wall surface of the trench; a base layer of the second conduction type which is provided on the semiconductor region via the gate insulating film so as to enclose a side wall except a bottom portion of the trench; a source region of the first conduction type which is formed adjacent to the gate insulating film outside the trench in the vicinity of a top surface of the base layer; and an insulating film which is formed at least partially between a bottom surface of the top end portion, which is extended from the trench of the gate electrode and formed to have a broader width than the width within the trench via a stepped portion, and a top surface of the source region and which is formed so as to have a film thickness larger than the film thickness of the gate insulating film within the trench.

A semiconductor device related to the second basic constitution is constituted by a semiconductor substrate of the first conduction type; a semiconductor region of the first conduction type which is formed on the semiconductor substrate; a gate electrode which is provided so that at least part of the gate electrode is present within a trench which is selectively formed in part of the semiconductor region; a gate insulating film which is formed between the trench and the gate electrode along a wall surface of the trench; a base layer of the second conduction type which is provided on the semiconductor region via the gate insulating film so as to enclose a side wall except a bottom portion of the trench; a source region of the first conduction type which is formed adjacent to the gate insulating film outside the trench in the vicinity of a top surface of the base layer; and a metal film which is formed from a metal or a metal compound and which is provided while maintaining a wide area in a position spaced from a top surface of the source region, which is a top surface of a top end portion of the gate electrode extended from the trench.

DESCRIPTION OF THE EMBODIMENTS

Figure 1:
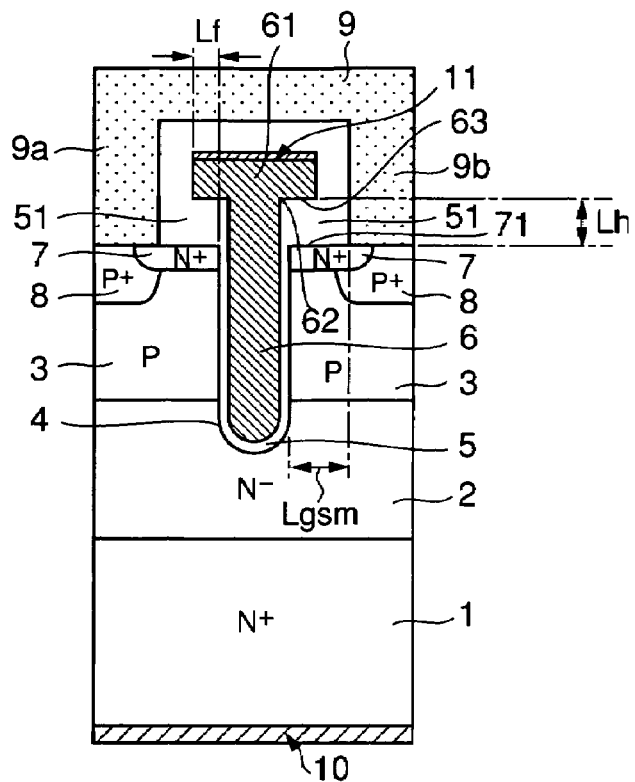
FIG. 1 is a partial sectional view which shows the construction of a semiconductor device related to the first embodiment of the present invention.

Embodiments of a semiconductor device related to the present invention will be described with reference to the accompanying drawings. Incidentally, in each of the drawings, component elements designated by the same reference numerals as used in other drawings are the same or corresponding component elements of other embodiments.

First Embodiment

Figure 17:
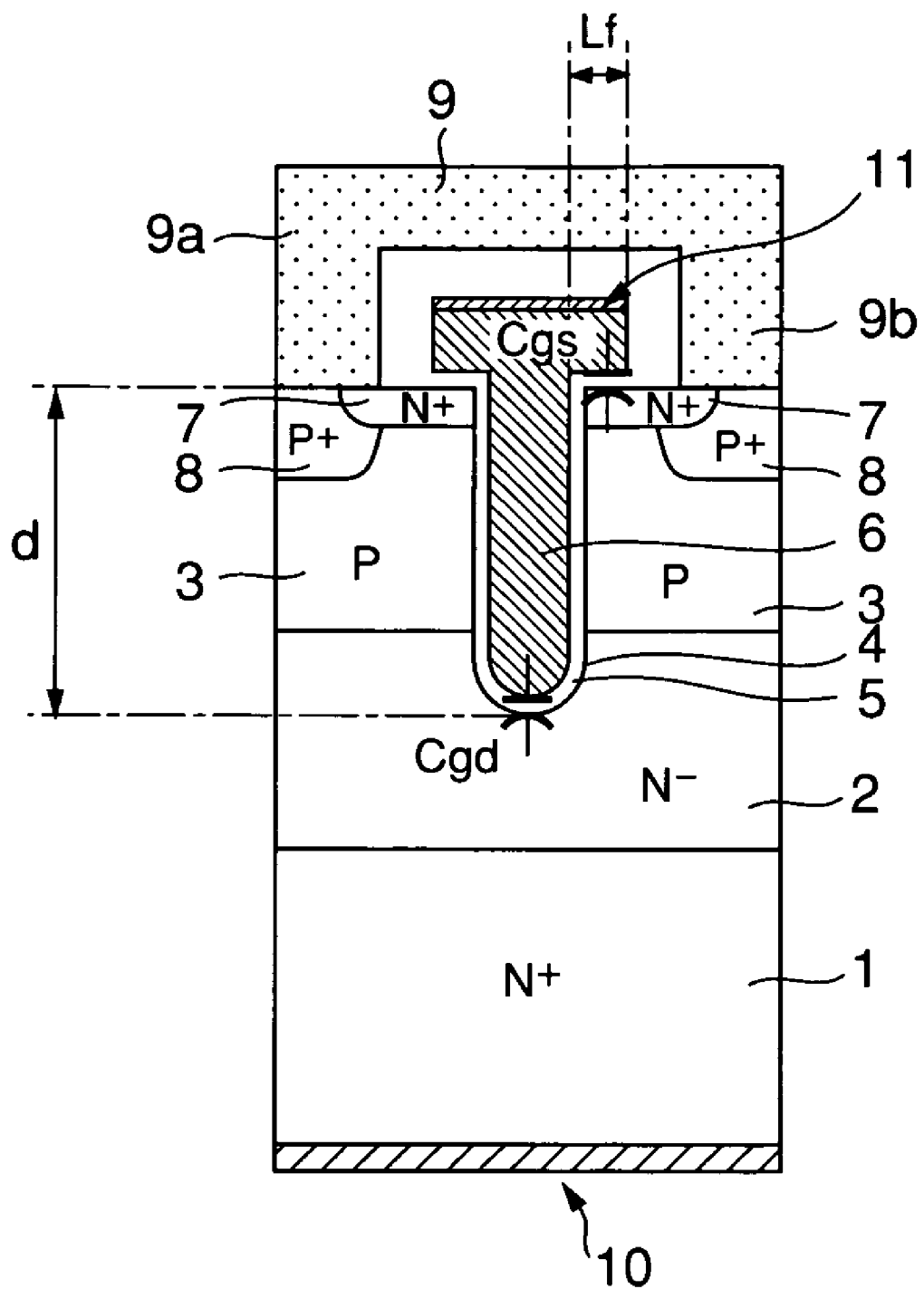
FIG. 17 is a partial sectional view which shows an example of the construction of a conventional semiconductor device.

FIG. 1 shows a semiconductor device related to the first embodiment which includes the first basic concept of the present invention. In the figure, the component elements designated by the same reference numerals as used in FIG. 17 of a conventional semiconductor device are the same or corresponding component elements as the conventional semiconductor device. As shown in FIG. 1, a semiconductor device related to the first embodiment is constituted by an $n^+$-type semiconductor substrate 1 of the first conduction type; an $n^-$-type semiconductor region 2 of the first conduction type which is formed on the semiconductor substrate 1; a p-type base layer 3 which is formed on this semiconductor layer 2; a gate electrode 6 at least part of which is present within a trench 4 which is selectively formed in part of the semiconductor region 2 by passing through the p-type base layer 3, and an extended top end portion 61 of which is formed to have a wide width via a stepped portion 62; a gate insulating film 5 which is formed between the trench 4 and the gate electrode 6 along a wall surface of the trench 4; an $n^+$-type source region 7 of the first conduction type which is formed adjacent to the gate insulating film 5 outside the trench 4 in the vicinity of a top surface of the p-type base layer 3; and an insulating film 51 which is formed at least partially between a bottom surface 63 of the top end portion 61, which is extended from within the trench 4 of the gate electrode 6 and formed to have a wider width than the width within the trench 4 via the stepped portion 62, and a top surface 71 of the source region 7 and which is formed so as to have a film thickness larger than the film thickness of the gate insulating film 5 within the trench 4. As shown in FIG. 1, the film thickness of the insulating film 51 is equivalent to the length Lh of the spacing between the top surface 71 of the source region 7 and the bottom surface 63 of the top end portion 61 having a widened width which is opposite to this top surface 71.

In a semiconductor device related to the first embodiment of the above-described construction, at least part of the gate electrode 6 is a silicide region 11 formed from a metal layer or a metal compound layer. This part is, for example, a top surface of the top end portion 61 which is formed to have a wide width via the stepped portion 62, and the silicide region 11 is provided in this top end portion 61. Because in this first embodiment, the maximum width of the top end portion 61 of the gate electrode 6 is the same as with a conventional semiconductor device, conditions related to the area of the silicide region 11 are the same as in the conventional semiconductor device. However, in this semiconductor device related to the first embodiment, the insulating film 51 having a sufficient thickness is provided between the bottom surface 63 of the top end portion 61, which is formed to have a wide width via the stepped portion 62 of the gate electrode 6, and the top surface 71 of the source region 7, and hence it is possible to reduce the gate-source capacitance Cgs.

When the length Lh in FIG. 1 increases in the above-described semiconductor device related to the first embodiment, the capacitance between the top surface 71 of the source region 7 and the bottom surface of the top end portion 61 of the gate electrode 6 decreases, whereas the capacitance between a source electrode 9 and the gate electrode 6 increases. Therefore, it is not always desirable that the length Lh be only increased to a maximum, and there is an optimum value between the length Lf by which the top end portion 61 overhangs and the length Lh of the spacing between the bottom surface of the gate electrode and the top surface 71 of the source region. It is necessary that the length Lh as this optimum value satisfy the following relational expression:

$$Lh^2 < Lf*Lgsm$$

Where in the bottom surface 63 of the top end portion 61 opposite to the top surface 71 of the source region 7, the length of the longest portion protruding from the trench is denoted by Lf, the film thickness of the thickest portion of the insulating film 51 is denoted by Lh and the length of a portion where the spacing between the trench and the source electrode is largest is denoted by Lgsm.

By satisfying this relational expression, it is possible to reduce gate resistance while maintaining the gate-source capacitance at a small value.

Second Embodiment

Figure 2:
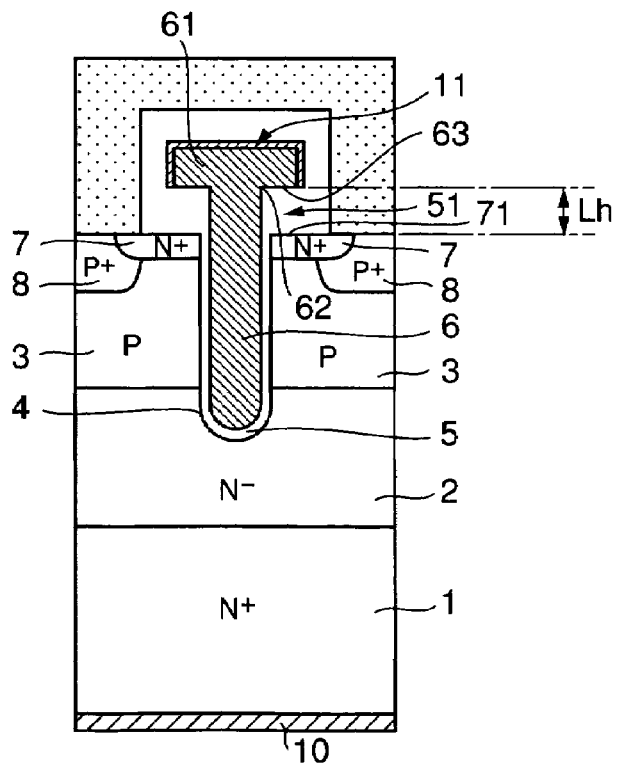
FIG. 2 is a partial sectional view which shows the construction of a semiconductor device related to the second embodiment of the present invention.

Next, a semiconductor device related to the second embodiment will be described with reference to FIG. 2. Although the semiconductor device related to the second embodiment is the same as the semiconductor device related to the first embodiment in terms of the basic construction, the semiconductor device related to the second embodiment is constructed to have a large area of a silicide region 11 as a metal layer provided in a top end portion 61 of a gate electrode 6. That is, as shown in FIG. 2, the silicide region 11 is provided from a top surface of the top end portion 61 having a wide width in the upper part of the gate electrode 6 to side walls.

According to the semiconductor device of the second embodiment having such a construction, it is possible to provide the silicide region in a range which is wide by the area of the side wall portion compared to the area of the silicide region in the first embodiment, and in addition to the construction which ensures a sufficient thickness of an insulating film 51 between the bottom surface 63 of the top end portion 61 of the gate electrode and a top surface 71 of a source region, it is possible to further reduce gate resistance.

Third Embodiment

Figure 3:
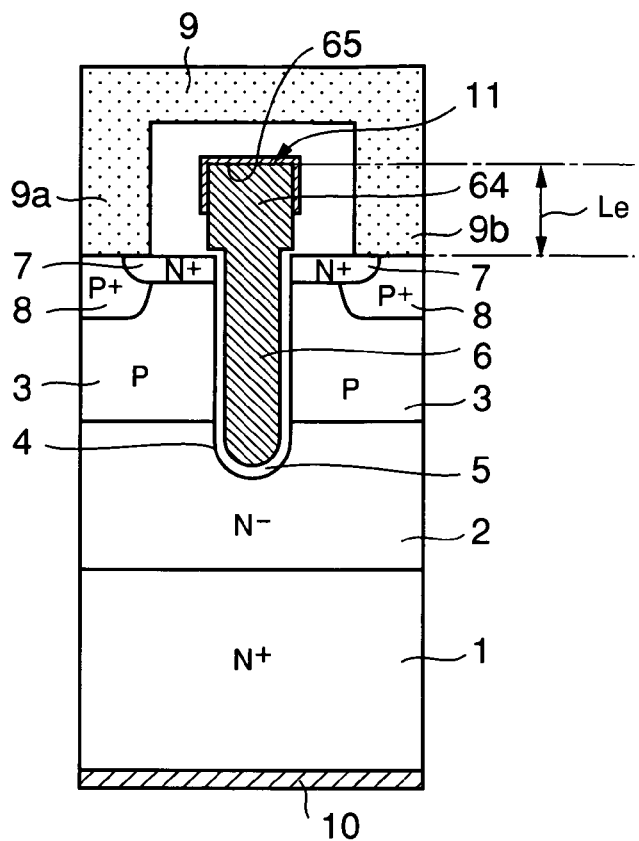
FIG. 3 is a partial sectional view which shows the construction of a semiconductor device related to the third embodiment of the present invention.

FIG. 3 shows a semiconductor device related to the third embodiment. In the semiconductor devices related to the first and second embodiments which are respectively shown in FIG. 1 and FIG. 2, part of the gate electrode is formed on the top surface 71 of the source region 7 via an insulating film which is thicker than the gate insulating film 5. In the third embodiment, a top end portion of a gate electrode 6 does not overhang over a source region 7. In this semiconductor device related to the third embodiment, the shape of a top end portion 64 is not formed to have a wide width as in the first and second embodiments, and as shown in FIG. 3, the top end portion 64 is formed thick so that the position of a top surface 65 of the top end portion 64 is away by the distance Le which sufficiently spaces the top surface 65 of the top end portion 64 from a top surface 71 of source region 7, whereby the cross-sectional area of the gate electrode can be increased. Furthermore, it is desirable to provide a silicide region 11 not only on the top surface 65 of the top end portion 64, but also on side walls thereof in order to increase the area of the silicide region. With such a construction in which the top end portion 64 of the gate electrode 6 does not have an overhanging portion, it is possible to shorten the cell pitch compared to the conventional semiconductor device shown in FIG. 17 and the semiconductor devices related to the first and second embodiments, and it is possible to reduce on-resistance by making the cell density dense.

The basic construction of the third embodiment will be described with reference to FIG. 3. In FIG. 3, the semiconductor device related to the third embodiment is constituted by an n$^+$-type semiconductor substrate 1 of the first conduction type; an n$^-$-type semiconductor region 2 of the first conduction type which is formed on the semiconductor substrate 1; a gate electrode 6 which is provided so that at least part of the gate electrode 6 is present within a trench 4 which is selectively formed in part of the semiconductor region 2; a gate insulating film 5 which is formed between the trench 4 and the gate electrode 6 along a wall surface of the trench 4; a p-type base layer 3 of the second conduction type which is provided on the semiconductor region 2 via the gate insulating film 5 so as to enclose a side wall except a bottom portion of the trench 4; an n$^+$ source region 7 as the first conduction type which is formed adjacent to the gate insulating film outside the trench in the vicinity of a top surface of the base layer 3; and a silicide region 11 as a metal film which is formed from a metal or a metal compound and which is provided while maintaining a wide area in a position spaced from a top surface of the source region, in an area of the gate electrode 6 ranging from a top surface 65 to side walls of a top end portion 64 having a prescribed thickness Le, which is extended from the trench 4.

The silicide region 11 as the metal layer is provided from the top surface 65 of the top end portion 64 of the gate electrode 6 to part of the surface of the side wall portion, and the silicide region as the metal layer occupies at least 20% of the area of the surface of the top end portion 64 of the gate electrode 6 projecting from a top surface 71 of the source region 7. The reason why the silicide region 11 is provided in at least 20% of the whole surface area of the top end portion 64 is that gate resistance can be reduced by a desired value.

Fourth Embodiment

Figure 4:
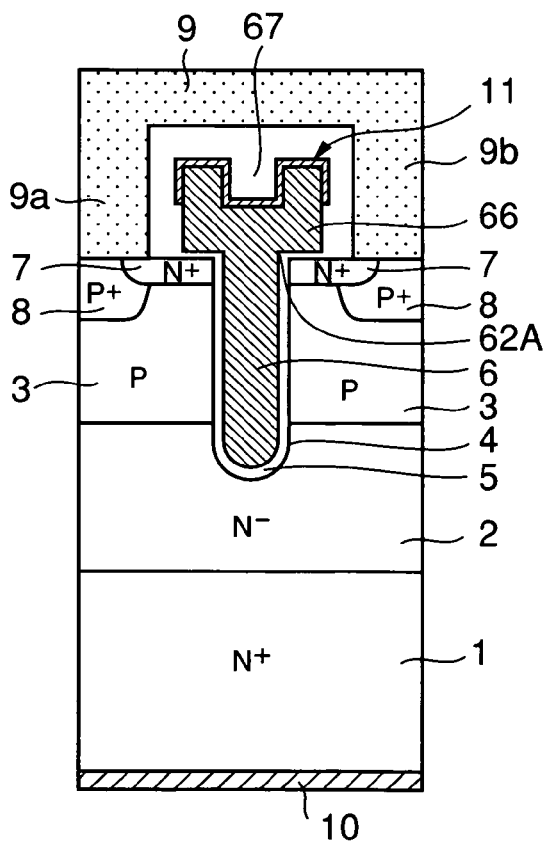
FIG. 4 is a partial sectional view which shows the construction of a semiconductor device related to the fourth embodiment of the present invention.

FIG. 4 shows a semiconductor device related to the fourth embodiment. In this fourth embodiment, the width of a top end portion 66 of a gate electrode 6 shown in FIG. 4 is widened a little via a small stepped portion 62A and a concavity 67 is provided on the top end portion, whereby it is possible to widen the area of a silicide region 11 provided on the surface of the top end portion 66. As a result of this, gate resistance can be reduced by widening the area of the whole of the silicide region 11. Furthermore, by providing the silicide region 11 also on side walls which are continuous from the top end portion, it is possible to widen the area of the silicide region 11. Although in the semiconductor device related to the fourth embodiment the capacitance Cgs between the gate and the source can be reduced, gate resistance is small compared to the sixth embodiment, which will be described later, due to a difference in construction. Compared to the third embodiment, the capacitance Cgs between the gate and the source increases although gate resistance can be reduced. Therefore, this fourth embodiment has a construction intermediate between the third embodiment and the sixth embodiment, which will be described later.

Fifth Embodiment

Figure 5:
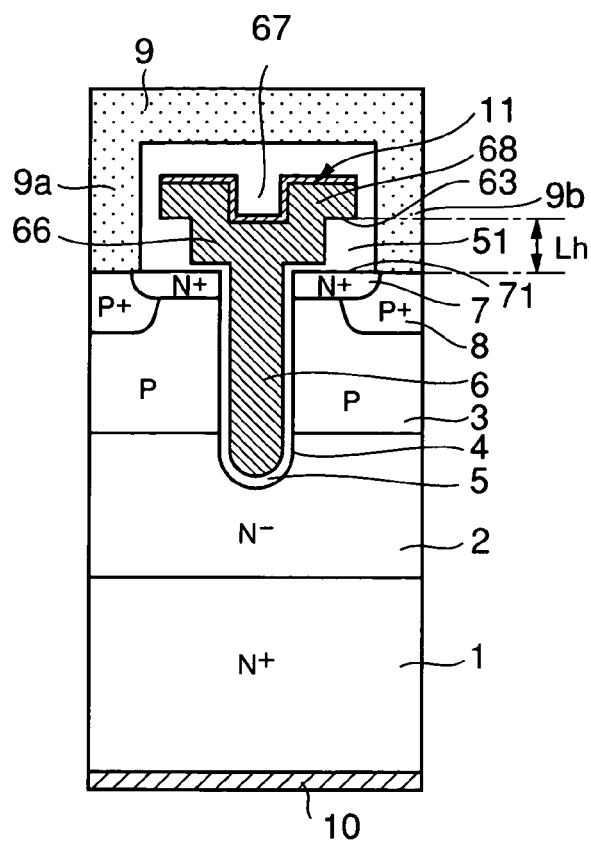
FIG. 5 is a partial sectional view which shows the construction of a semiconductor device related to the fifth embodiment of the present invention.

FIG. 5 is a sectional view which shows the construction of a MOSFET as a semiconductor device related to the fifth embodiment of the present invention. In FIG. 5, an $n^-$-type semiconductor layer 2 is formed on an $n^+$-type semiconductor substrate 1 of the first conduction type by epitaxial growth. A p-type base region 3 is formed on this $n^-$-type semiconductor layer 2, and a trench 4 is formed so as to penetrate the p-type base region 3. A gate insulating film 5 is provided along an inner surface of this trench 4, and a gate electrode 6 formed from polycrystalline silicon is buried via this gate insulating film 5. On the top end side of the p-type base region 3, adjacent to the trench 4, an $n^+$-type source 7 and a $p^+$-type contact region 8 which comes into contact with a p-type base region are provided. A top end portion 66 of the gate electrode 6 which projects upward from the trench 4 is formed on an insulating film 51 which is thicker than the gate oxide film 5. As in the conventional semiconductor device, a source electrode 9 is formed via top metals 9a, 9b each of which comes into contact with both of the source region 7 and the body region (contact region 8). A drain electrode 10 is formed on the back side of the $n^+$-type semiconductor substrate 1 (in the figure, the bottom side).

In this fifth embodiment, an overhanging portion 68 of the top end portion 66 of the gate electrode 6 is formed over the source region 7 via the insulating film 51 which is thicker than the gate oxide film 5, and the gate electrode 6 has a such shape that a concavity 67 is left in the middle of the overhanging portion 68 of the top end portion 66. When the gate electrode 6 is formed like this, it is possible to increase the area of the silicide region 11 compared to the conventional semiconductor device under the condition that the maximum width of the top end portion 66 and overhanging portion 68 of the gate electrode 6 is the same. Because the overhanging portion 68 of the top end portion 66 of the gate electrode 6 overhangs on the thick oxide layer 51, the gate-source capacitance Cgs can be reduced compared to a construction in which as in the conventional example shown in FIG. 17, the length Lf of the overhanging portion is simply extended.

Incidentally, the construction of the fifth embodiment is closely analogous to the construction of the first embodiment shown in FIG. 1 in that the gate electrode 6 is constructed so that a bottom surface 63 of the overhanging portion 68 of the gate electrode 6 is spaced from a top surface 71 of the source region 7 by the length Lh. And the construction of the fifth embodiment is closely analogous to the construction of the semiconductor devices related to the third and fourth embodiments respectively shown in FIG. 3 and FIG. 4 in that the gate electrode 6 is constructed so that by increasing the size of the top end portion 66 of the gate electrode 6 including the overhanging portion 68, the area of a silicide region 11 is increased thereby to reduce gate resistance.

Sixth Embodiment

Figure 6:
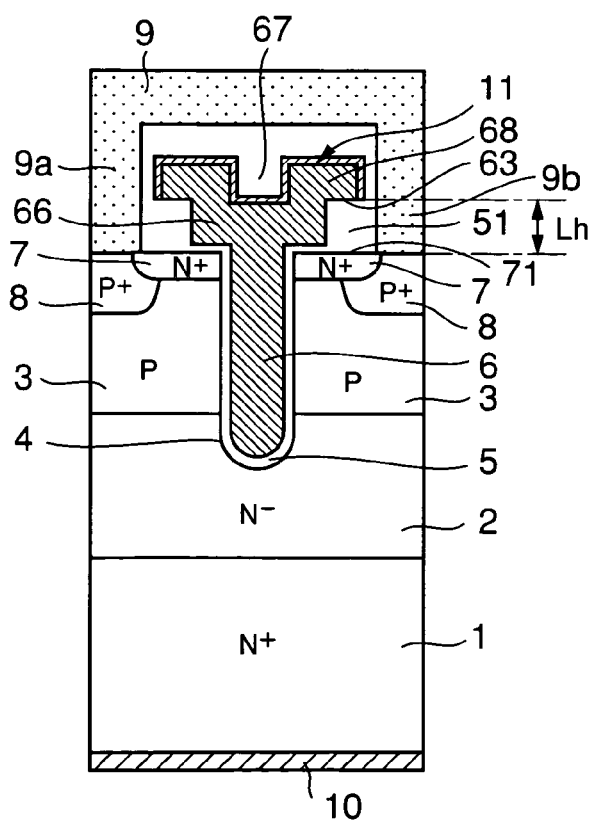
FIG. 6 is a partial sectional view which shows the construction of a semiconductor device related to the sixth embodiment of the present invention.

FIG. 6 shows a semiconductor device related to the sixth embodiment. In the sixth embodiment, compared to the basic construction of the semiconductor device of the fifth embodiment shown in FIG. 5, a silicide region 11 is provided also on side walls of an overhanging portion 68, whereby gate resistance can be further lowered compared to the fifth embodiment. That is, the sixth embodiment is the same as with the fifth embodiment in the basic construction of a top end portion 66 and overhanging portion 68 having a concavity 67 of a gate electrode 6. However, the sixth embodiment differs from the fifth embodiment in that the area in which the silicide region 11 is provided increases. In other respects of construction, the sixth embodiment has the same construction as the fifth embodiment shown in FIG. 5.

Incidentally, the present invention is not limited to the above-described embodiments and can be modified in various manners. For example, the shape of the top end portion 61 shown in FIG. 2 is changed to the shape of the top end portion 66 shown in FIG. 4, whereby the area of the side wall portion of the silicide region 11 can also be further increased. Incidentally, in the above-described embodiments, descriptions have been given of a case where the first conduction type is an n-type and the second conduction type is a p-type. However, the present invention is not limited to this case, and even in a case where the first conduction type is a p-type and the second conduction type is an n-type, similar effects can be obtained by carrying out the present invention in the same way. In other respects, the present invention can be carried out by being modified in various manners in a range not departing from the gist of the invention.

Seventh Embodiment

Next, with reference to FIG. 7 to FIG. 16 a description will be given of a method of manufacturing a semiconductor device related to the seventh embodiment with respect to a method of manufacturing a vertical MOSFET as an example of a semiconductor device related to the present invention. A final semiconductor device manufactured by the manufacturing method of this seventh embodiment is the semiconductor device related to the sixth embodiment shown in FIG. 6.

Figure 7:
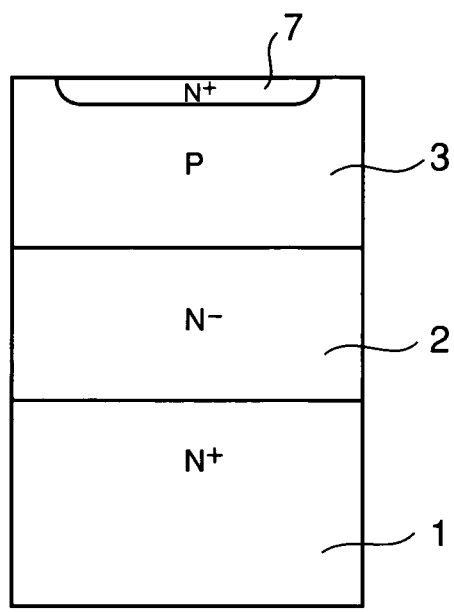
FIG. 7 is a partial sectional view which shows the manufacturing process of a semiconductor device related to the seventh embodiment of the present invention.

First, in the first step shown in the sectional view of FIG. 7, an $n^-$type single crystal silicon epitaxial layer 2 is formed on the whole top surface of an $n^+$-type single crystal silicon substrate 1 as the first conduction type by the epitaxial growth process. And subsequently, a p-type base diffusion layer 3 and an n-type source diffusion layer 7 are formed by repeating photolithography, an impurity ion implanting technique and an impurity diffusion technique. Incidentally, the diffusion step of the p-type base diffusion layer 3 and the n-type source diffusion layer 7 in this first step may be performed after the formation of a gate thereby to form these layers.

Figure 8:
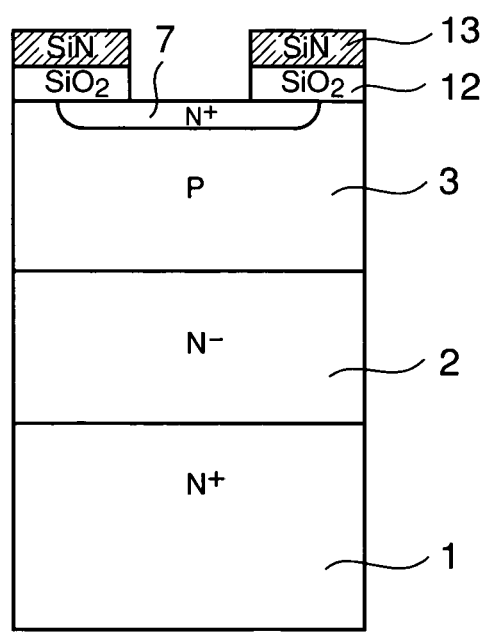
FIG. 8 is a partial sectional view which shows the manufacturing process of a semiconductor device related to the seventh embodiment of the present invention.

Next, in the second step shown in FIG. 8, a silicon oxide film and silicon nitride film are formed on the surfaces of the p-type base diffusion layer 3 and the n-type source diffusion layer 7. After that, the silicon oxide ($SiO_2$) film 12 and the silicon nitride (SiN) film 13 which become masks for trench formation are patterned to a prescribed shape.

Figure 9:
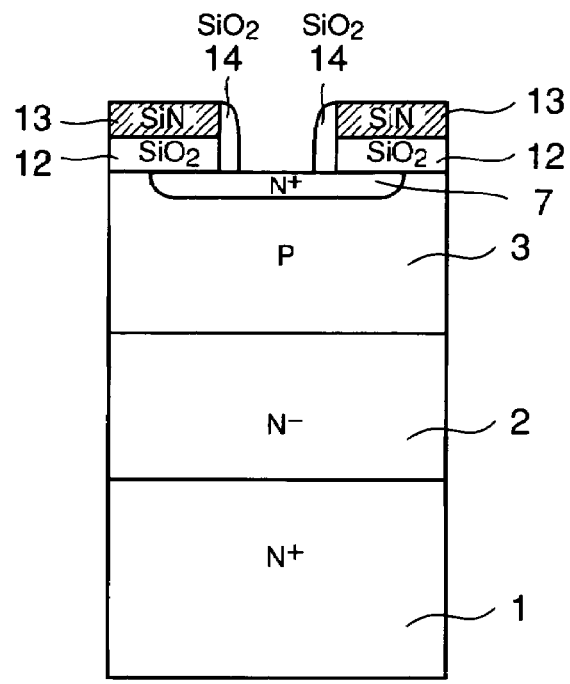
FIG. 9 is a partial sectional view which shows the manufacturing process of a semiconductor device related to the seventh embodiment of the present invention.

Next, in the step shown in the sectional view of FIG. 9, a silicon oxide ($SiO_2$) film is wholly deposited from above the silicon oxide film 12 and the silicon nitride film 13 by use of a technique such as the CVD (chemical vapor deposition) process, and after that, the insulating films 14, 14 deposited by the CVD process or the like are left only in the side wall portion by RIE (reactive ion etching), which is anisotropic etching.

Figure 10:
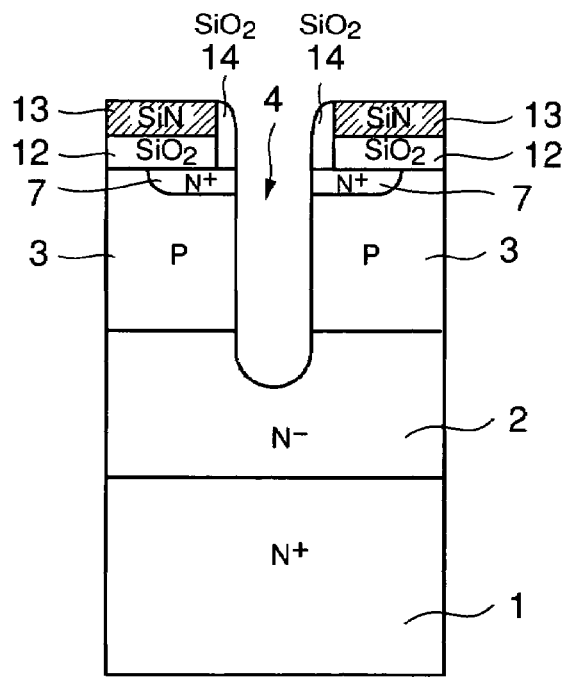
FIG. 10 is a partial sectional view which shows the manufacturing process of a semiconductor device related to the seventh embodiment of the present invention.

Next, in the step shown in the sectional view of FIG. 10, by use of the silicon oxide films 12, 14 and the silicon nitride film 13 as masks, a trench 4 which reaches the inside of the n-type single crystal epitaxial layer 2 is formed in the silicon substrate by using a silicon etching technique so as to penetrate the n-type source diffusion layer 7 and the p-type base diffusion layer 3.

Figure 11:
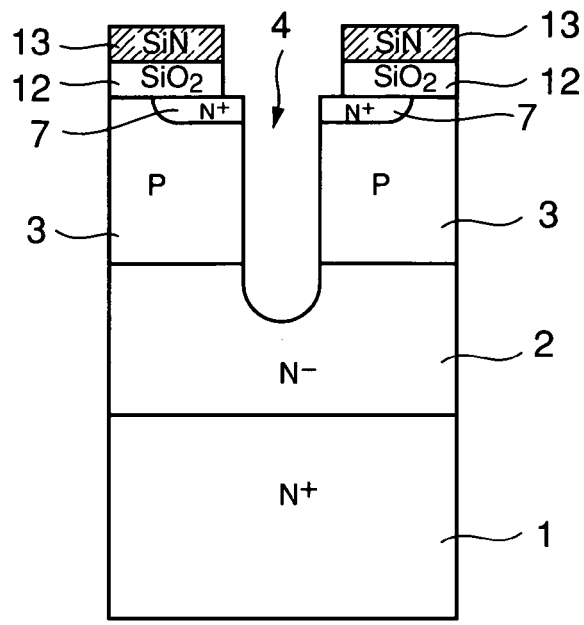
FIG. 11 is a partial sectional view which shows the manufacturing process of a semiconductor device related to the seventh embodiment of the present invention.
Figure 12:
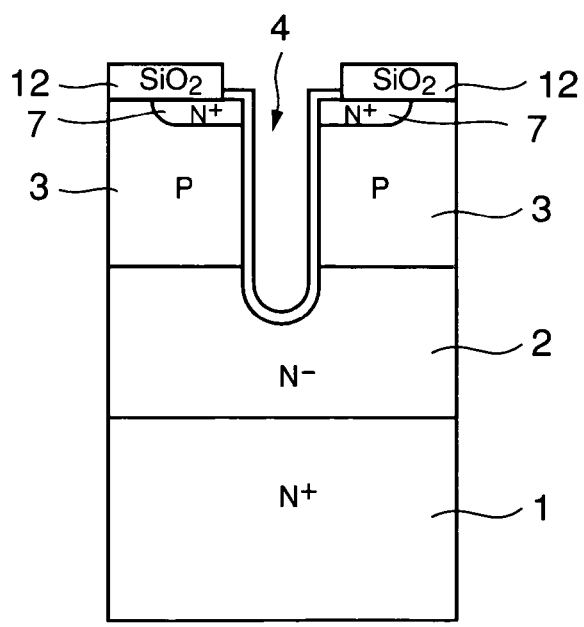
FIG. 12 is a partial sectional view which shows the manufacturing process of a semiconductor device related to the seventh embodiment of the present invention.

Next, in the step shown in the sectional views of FIGS. 11 and 12, the silicon oxide film 14 formed by CVD is removed and after that, the silicon nitride film 13 is etched. After the etching, a silicon oxide film which becomes a gate oxide film 5 is formed on an inner wall surface of the trench 4 and on part of the $n^+$-type source layer 7.

Figure 13:
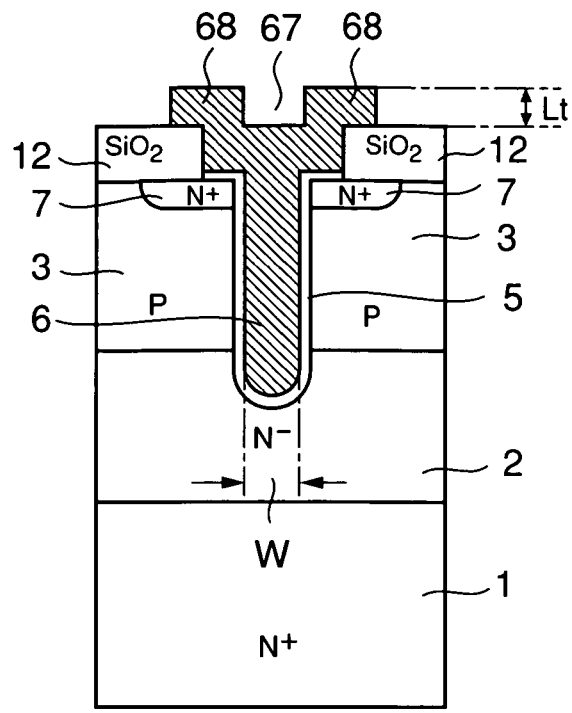
FIG. 13 is a partial sectional view which shows the manufacturing process of a semiconductor device related to the seventh embodiment of the present invention.

Next, in the step shown in FIG. 13, by use of a CVD technique a polycrystalline silicon film containing an n-type impurity is deposited so as to be buried in the trench. If the trench width is denoted by W and the thickness of the overhanging portion 68 of the top end portion 66 of the polycrystalline silicon film 6 which is deposited is denoted by Lt, it is preferred that the following relational expression hold:

$$W \geq 2 \times Lt$$

By depositing the polycrystalline silicon film so as to satisfy this relational expression, it becomes possible to increase the surface area of the top end portion 66 and overhanging portion 68 of the gate electrode 6 which are not in contact with the trench 4 or the $N^+$-type source 7.

Figure 14:
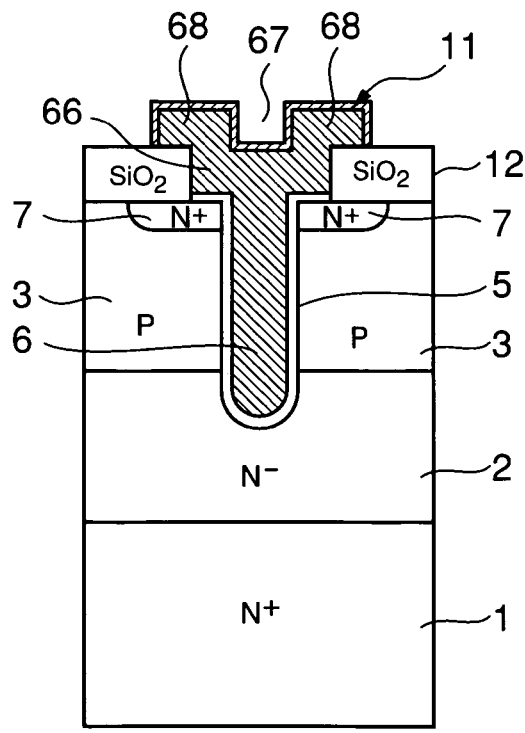
FIG. 14 is a partial sectional view which shows the manufacturing process of a semiconductor device related to the seventh embodiment of the present invention.

Next, in the step shown in FIG. 14, by sputtering with a metal, such as titanium (Ti) and cobalt (Co), for example, a metal film is formed on the polycrystalline silicon film which becomes the overhanging portion 68 of the gate electrode. After that, the surface of the polycrystalline silicon film is silicidized by causing the polycrystalline silicon film and the metal film to react chemically and a silicide region 11 is formed by removing the metal film on the silicon insulating film 12.

Figure 15:
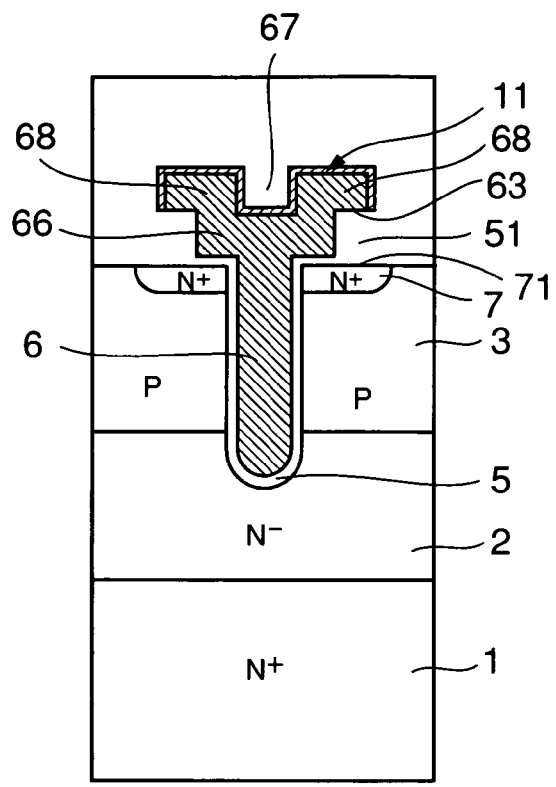
FIG. 15 is a partial sectional view which shows the manufacturing process of a semiconductor device related to the seventh embodiment of the present invention.

Next, in the step shown in FIG. 15, a silicon insulating film 50 is deposited by using a CVD technique. At this time, an insulating film 51 which is thicker than the gate insulating film 5 is formed between the bottom surface 63 of the overhanging portion 68 and the top surface 71 of the n-type source region 7.

Figure 16:
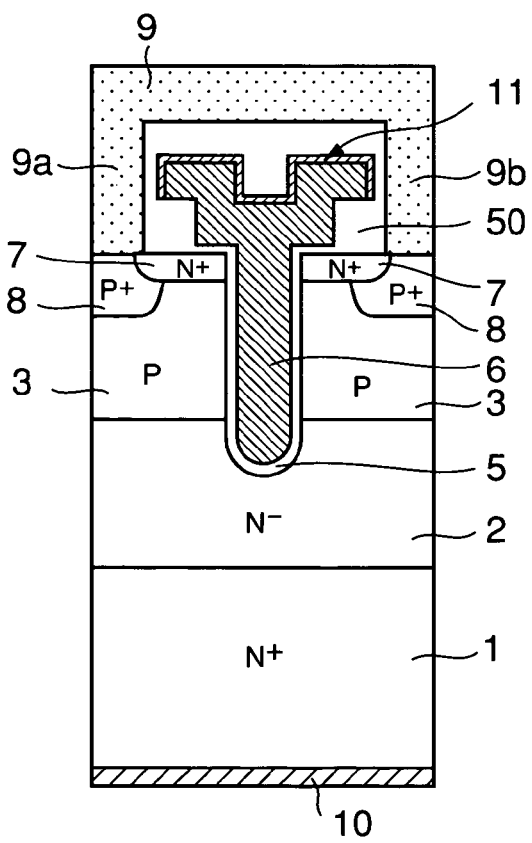
FIG. 16 is a partial sectional view which shows the manufacturing process of a semiconductor device related to the seventh embodiment of the present invention.

After that, as shown in FIG. 16, the silicon insulating film 50 is etched by RIE or the like so as to come into contact with the p-type base layer 3 and the n-type source region 7, and a p-base contact layer 8 is implanted in a position adjacent to the source region 7. After that, a source electrode 9 is formed on the source region 7 and contact layer 8 of the n-type source region 7. On the other hand, a drain electrode 10 is formed on the back side of the $n^+$-type single crystal semiconductor substrate 1 (in the figure, the bottom side).

Eighth Embodiment

Incidentally, the above-described method of manufacturing a vertical MOSFET related to the seventh embodiment shows one concrete constitution of a method of manufacturing a semiconductor device, and a method of manufacturing a semiconductor device related to the present invention is not limited to the order of each step in the seventh embodiment. It is also possible to obtain semiconductor devices related to the first to sixth embodiments by changing the order of each step.

For example, the above description was such that in the first step of the seventh embodiment shown in FIG. 7, after the formation of the n-type single crystal silicon epitaxial layer 2, the p-type base diffusion layer 3 and the n-type source diffusion layer 7 are formed and a mask for trench formation is then patterned in the second step shown in FIG. 8. However, the p-type base diffusion layer 3 and the n-type source diffusion layer 7 may be formed after the making of the trench and after the formation of the gate, though a description based on diagrammatic representation is omitted. That is, in the first step shown in FIG. 7, only the n-type single crystal polycrystalline silicon epitaxial layer 2 is formed on the whole surface of the $n^+$-type single crystal silicon substrate 1 by an epitaxial growth process, and it is possible to perform the step of forming the p-type base diffusion layer 3 and the n-type source diffusion layer 7 by use of photolithography, an impurity ion implanting technique, an impurity diffusion technique, etc. during the oxidation step of forming the gate insulating film after the formation of the trench or during later heat treatment etc.

On that occasion, even when the p-type base diffusion layer 3 is formed by irradiation with beams in the first step shown in FIG. 7, there is a possibility that p-type base diffusion layer 3 diffuses also after the first step by heat treatment etc. in other subsequent steps. However, it is possible to control the layer thickness of the diffusion layer 3 by performing diffusion under heating while controlling the temperature in one of last steps after the formation of the trench and after the formation of the gate oxide film by heating treatment.

Also, for the n-type source diffusion layer 7, only the implantation of an n-type impurity ion such as arsenic (As) is performed in an early stage and it is possible to perform the diffusion of this impurity after the formation of the trench, after the formation of the gate oxide film, or in the same step as the formation of the gate oxide film. To put it briefly, according to the manufacturing method of a semiconductor device in the eighth embodiment, it is not always necessary that the formation of the p-type base diffusion layer 3 and the implantation of an impurity ion in the n-type diffusion layer 7 be performed in the first step of the seventh embodiment shown in FIG. 7.

By thus performing the formation of the p-type base diffusion layer 3 and the implantation of an impurity ion in the n-type diffusion layer 7 in a later step, it is possible to more finely perform the control of the layer thickness of the p-type base diffusion layer 3 and the control of impurity diffusion of the n-type diffusion layer 7.

According to a semiconductor device having the above-described constitutions, it is possible to improve the tradeoff relation between the gate resistance and input capacitance of a MOSFET as a result of the two constitutions. First, by making the thickness of the gate insulating film between the top surface of the source region and the opposed surface of the width-widened region of the upper part of the gate electrode opposite to the top surface of the source region thicker than the thickness of the gate insulating film within the trench, the gate-source capacitance is reduced and the tradeoff relation between the gate resistance and the input capacitance is improved.

Furthermore, by efficiently increasing the area of the silicide region formed on the top surface of the gate electrode, it is also possible to improve the tradeoff relation between the gate resistance and input capacitance of a vertical MOSFET. The present invention can apply to not only MOSFET but also other MOS-type transistors such as IGBT (Insulated Gate Bipolar Transistor).

What is claimed is:

1. A semiconductor device, comprising:
   a semiconductor substrate of the first conduction type;
   a semiconductor region of the first conduction type which is formed on the semiconductor substrate;
   a gate electrode at least part of which is present within a trench which is selectively formed in part of the semiconductor region, and an extended top end portion of which is formed to have a wide width via a stepped portion;
   a gate insulating film which is formed between the trench and the gate electrode along a wall surface of the trench;
   a base layer of the second conduction type which is provided on the semiconductor region via the gate insulating film so as to enclose a side wall except a bottom portion of the trench;
   a source region of the first conduction type which is formed adjacent to the gate insulating film outside the trench in the vicinity of a top surface of the base layer; and
   an insulating film which is formed at least partially between a bottom surface of the top end portion and a top surface of the source region and which is formed so as to have a film thickness larger than the film thickness of the gate insulating film within the trench, in which the top end portion is extended from the trench of the gate electrode and formed to have a wider width than the width within the trench via the stepped portion.

2. The semiconductor device according to claim 1, wherein at least part of the gate electrode is formed from a metal or a metal compound.

3. The semiconductor device according to claim 2, wherein part of the gate electrode which is formed from the metal or the metal compound is the top end portion which is formed to have a wide width via the stepped portion.

4. The semiconductor device according to claim 3, wherein part of the gate electrode which is formed from the metal or the metal compound is a silicide region and this silicide region is formed only on a top surface of the top end portion of the gate electrode.

5. The semiconductor device according to claim 3, wherein part of the gate electrode which is formed from the metal or the metal compound is a silicide region and this silicide region is formed on a top surface of a top end portion of the gate electrode and in a side wall portion of the top end portion.

6. The semiconductor device according to claim 1, wherein the gate electrode is provided by being extended from a portion present within the trench while maintaining a wide area in a position spaced from a top surface of the source region.

7. The semiconductor device according to claim 6, wherein the top end portion of the gate electrode has a top surface in a substantially central part of which a concavity is formed.

8. The semiconductor device according to claim 7, wherein the top end portion of the gate electrode which is formed from the metal or the metal compound is a silicide region and this silicide region is formed only on the top surface of the top end portion of the gate electrode.

9. The semiconductor device according to claim 8, wherein part of the gate electrode which is formed from the metal or the metal compound is a silicide region and this silicide region is formed on the top surface of the top end portion of the gate electrode and in a side wall portion of the top end portion.

10. A semiconductor device, comprising:
    a semiconductor substrate of the first conduction type;
    a semiconductor region of the first conduction type which is formed on the semiconductor substrate;
    a gate electrode which is provided so that at least part of the gate electrode is present within a trench which is selectively formed in part of the semiconductor region;
    a gate insulating film which is formed between the trench and the gate electrode along a wall surface of the trench;
    a base layer of the second conduction type which is provided on the semiconductor region via the gate insulating film so as to enclose a side wall except a bottom portion of the trench;
    a source region of the first conduction type which is formed adjacent to the gate insulating film outside the trench in the vicinity of a top surface of the base layer; and
    a metal film which is formed from a metal or a metal compound and which is provided while maintaining a wide area in a position spaced from a top surface of the source region, which is a top surface of a top end portion of the gate electrode extended from the trench.

11. The semiconductor device according to claim 10, wherein the top end portion of the gate electrode is formed to have a wide width in a portion protruding upward from the trench and has a wide width portion provided with a concavity on a top side of a portion present within the trench, and a silicide region formed from the metal or the metal compound is formed over a wide area of the top surface including the concavity of this wide width portion.

12. The semiconductor device according to claim 11, wherein the silicide region is provided on the whole top surface including the concavity and provided also in part of a side wall.

13. The semiconductor device according to claim 12, wherein the metal layer is formed from a top surface of the top end portion of the gate electrode to part of a side wall portion and the region of the metal layer occupies at least 20% of the area of the gate electrode protruding from the top surface of the source region.

14. The semiconductor device according to claim 12, wherein the top end portion of the gate electrode is provided with an overhanging portion which overhangs further sideward from the wide width portion via a stepped portion, at least partially between a top surface of the source region and a bottom surface of the overhanging portion, there is provided an insulating film which is formed to have a film thickness larger than the film thickness of the gate insulating film within the trench, and a silicide region as a metal film which is formed from the metal or the metal compound is formed over a wide area of the top surface of the top end portion including the overhanging portion.

15. The semiconductor device according to claim 14, wherein the suicide region is provided on the whole top surface including the concavity and also provided in part of a side wall.

16. The semiconductor device according to claim 15, wherein the metal layer is formed from a top surface of the top end portion of the gate electrode to part of a side wall portion and the region of the metal layer occupies at least 20% of the area of the gate electrode protruding from the top surface of the source region.

17. A method of manufacturing a semiconductor device including a vertical MOSFET, comprising:

forming a single crystal semiconductor layer of the first conduction type by an epitaxial growth process on the whole top surface of a single crystal semiconductor substrate of the first conduction type, next forming a base diffusion layer of the second conduction type by repeating photolithography treatment, impurity ion implantation and impurity diffusion on the single crystal semiconductor layer, and selectively forming a source diffusion layer of the first conduction type on a surface of this base diffusion layer;

forming an oxide film and nitride film on surfaces of the base diffusion layer and the source diffusion layer, then performing patterning to a prescribed shape, and performing etching by use of this patterning as a mask, whereby a trench which pierces through the base diffusion layer and reaches the single crystal semiconductor layer is formed;

removing the nitride film and then forming an oxide film, which becomes a gate oxide film, on an inner wall surface of the trench and on a top surface of the source diffusion layer;

depositing a polycrystalline semiconductor film including an impurity of the first conduction type in the trench by being buried in such a manner that the width of the trench and a top end portion protruding upward from the trench satisfy a prescribed relationship, whereby a gate electrode and a top end portion thereof are formed;

etching an insulating film so as to come into contact with top surfaces of the base layer and the source layer, implanting a base contact layer of the second conduction type in a position adjacent to the source layer by implanting, and thereafter forming a source electrode on top of the source layer and contact layer of the semiconductor substrate; and forming a drain electrode on a surface opposite to a surface on which the source electrode of the single crystal semiconductor substrate of the first conduction type.

18. The method of manufacturing a semiconductor device according to claim 17, further comprising:

sputtering the top end portion of the gate electrode with a metal after the formation of the gate electrode and the top end portion thereof, whereby a metal film is formed on the polycrystalline semiconductor film, which becomes an overhanging portion of the gate electrode, and thereafter the polycrystalline semiconductor film and the metal film are caused to chemically react with each other, whereby a silicide region is formed on a surface of the polycrystalline semiconductor film.

19. The method of manufacturing a semiconductor device according to claim 17, further comprising:

further forming an overhanging portion which overhangs further outward from both sides of the top surface of the top end portion after the formation of the gate electrode and the top end portion, and depositing an insulating film on top of the overhanging portion, whereby an insulating film thicker than the gate insulating film is formed between a bottom surface of the overhanging portion and the top surface of the source region.

20. The method of manufacturing a semiconductor device according to claim 19, wherein the prescribed relationship between the trench width and the top end portion protruding upward from the trench satisfies the relational expression $W \geq 2 \times Lt$, where the trench width is $W$, and the thickness of the overhanging portion of the top end portion of the deposited polycrystalline semiconductor film is $Lt$, with the result that surface areas of the top end portion of the gate electrode and the overhanging portion which are not in contact with the trench and source layer due to the deposition of the polycrystalline semiconductor film are sufficiently increased.

* * * * *